(12) United States Patent
Becker et al.

(10) Patent No.: US 9,202,966 B2
(45) Date of Patent: Dec. 1, 2015

(54) PHOTOVOLTAIC MODULE STRUCTURE AND METHOD FOR PRODUCING AN ELECTRICALLY CONDUCTIVE CONNECTION

(75) Inventors: Frank Becker, Leipzig (DE); Michael Bauer, Leipzig (DE); Jochen Frenck, Wolfen (DE); Robert Fischer, Halle/Saale (DE)

(73) Assignee: Calyxo GmbH, Bitterfeld-Wolfen (DE)

( * ) Notice: Subject to any disclaimer, the term of this patent is extended or adjusted under 35 U.S.C. 154(b) by 235 days.

(21) Appl. No.: 13/512,134

(22) PCT Filed: Nov. 10, 2010

(86) PCT No.: PCT/EP2010/006841
§ 371 (c)(1),
(2), (4) Date: May 25, 2012

(87) PCT Pub. No.: WO2011/063894
PCT Pub. Date: Jun. 3, 2011

(65) Prior Publication Data
US 2012/0280349 A1 Nov. 8, 2012

(30) Foreign Application Priority Data

Nov. 25, 2009 (DE) .................... 10 2009 055 675

(51) Int. Cl.
| | | |
|---|---|---|
| H01L 27/142 | (2014.01) | |
| H01L 31/073 | (2012.01) | |
| H01L 31/0224 | (2006.01) | |
| H01L 31/18 | (2006.01) | |
| H01L 31/0392 | (2006.01) | |

(52) U.S. Cl.
CPC ........ *H01L 31/1828* (2013.01); *H01L 27/1425* (2013.01); *H01L 27/1426* (2013.01); *H01L 31/022466* (2013.01); *H01L 31/0392* (2013.01); *H01L 31/073* (2013.01); *Y02E 10/543* (2013.01)

(58) Field of Classification Search
CPC ............ H01L 27/1425; H01L 27/1426; H01L 31/22466; H01L 31/73; H01L 31/1828; H01L 31/392

USPC ........................... 257/E27.124, E27.125, 443
See application file for complete search history.

(56) References Cited

U.S. PATENT DOCUMENTS

| 4,517,403 A | 5/1985 | Morel | |
|---|---|---|---|
| 2008/0047599 A1* | 2/2008 | Buller et al. .................. | 136/251 |

FOREIGN PATENT DOCUMENTS

| DE | 4324318 C1 | 1/1995 |
|---|---|---|
| EP | 0749161 A2 | 12/1996 |
| KR | 20090067351 A | 6/2009 |

OTHER PUBLICATIONS

Loffler, J. et al, "Depth Selective Laser Scribing for Thin-Film Silicon Solar Cells on Flexible Substrates", Photovoltaic Specialists Conference (PVSC), 2009 34th IEEE, IEEE, Piscataway, NJ, USA, Jun. 7, 2009, pp. 1227-1231 XP031626526, ISBN: 978-4244-2949-3.
Compaan, A.D. et al, "Laser Scribing of Polycrystalline Thin Films", Optics and Lasers in Engineering, Elsevier, vol. 34, No. 1, Jul. 1, 2000, pp. 15-45, XP002630780, ISSN: 0143-8166, DOI: 10.1016/S0143-8166 (00)00061-0, Department of Physics and Astronomy, The University of Toledo, Toledo, Ohio 43606 USA.

* cited by examiner

*Primary Examiner* — Mark A. Laurenzi, III
*Assistant Examiner* — Alexander Belousov
(74) *Attorney, Agent, or Firm* — Fraser Clemens Martin & Miller LLC; J. Douglas Miller

(57) ABSTRACT

The present invention relates to a photovoltaic module structure 1 and to a method for establishing an electrically conductive connection between two spaced contact layers 4", 6', in particular in the photovoltaic module structure 1 according to the invention. The production method is particularly simple and economical and the photovoltaic module structure 1 according to the invention enables a significant gain in efficiency.

7 Claims, 5 Drawing Sheets

Figure 1:
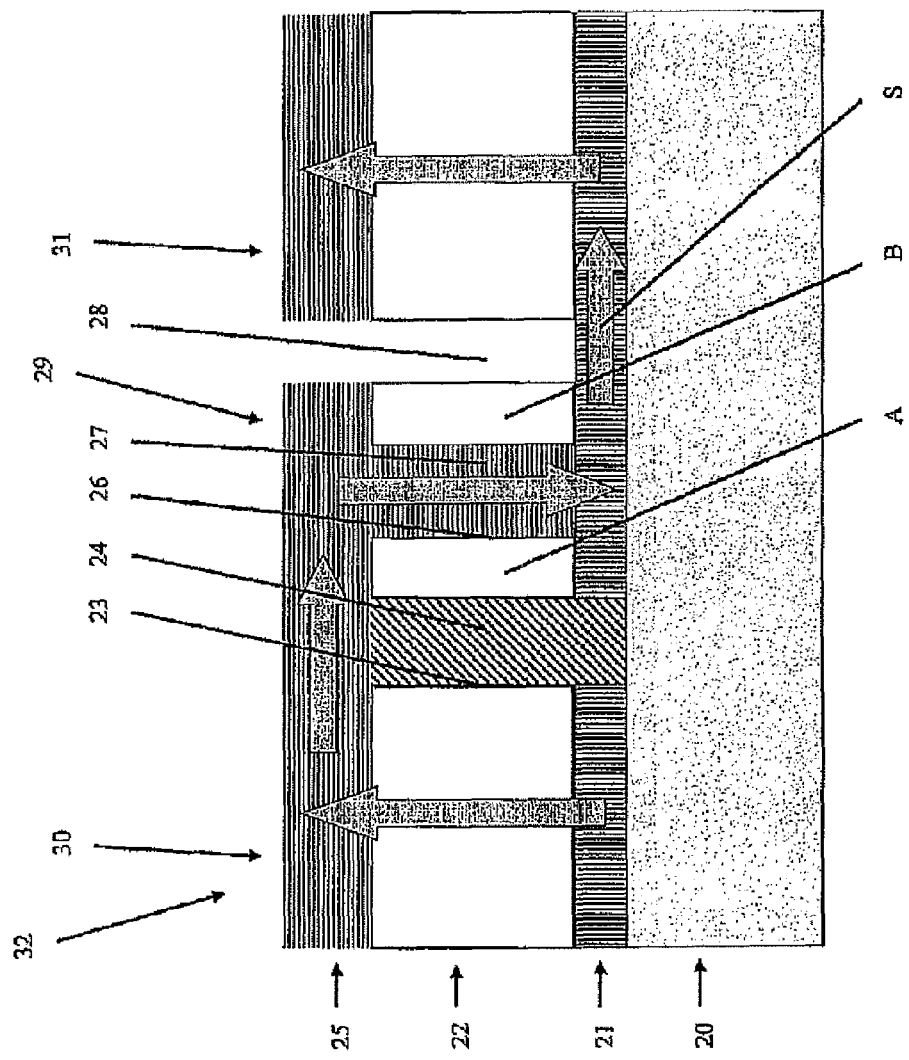

PHOTOVOLTAIC MODULE STRUCTURE AND METHOD FOR PRODUCING AN ELECTRICALLY CONDUCTIVE CONNECTION

The present invention relates to a photovoltaic module structure according to a method for producing an electrically conductive connection between two spaced-apart contact layers, in particular in a photovoltaic module structure.

Photovoltaic modules are widely used nowadays, in which case, despite a somewhat lower level of efficiency, thin-film photovoltaic module structures have become very important on account of their considerably lower material requirement. Such thin-film photovoltaic module structures have photoactive layers with layer thicknesses of the order of magnitude of μm, and compound semiconductors such as CdTe or $Cu(In, Ga)(S,Se)_2$ (called CIS or CIGS for short) are also used as semiconductor materials in addition to the pure semiconductors of silicon and germanium.

Such a photovoltaic module structure usually has a plurality of photovoltaically active regions which are connected in series with one another in order to generate a sufficiently large voltage. In this case, the connection in series is usually produced by providing a junction between two photovoltaically active regions having contact layers running in one plane, in which junction the lower contact layer of one region is connected to the upper contact layer of the other region in an electrically conductive manner, as shown in EP 0 749 161 B1, for example.

Three patterning steps are usually carried out in order to produce such a junction, which steps are usually carried out by means of laser patterning, as described by way of example below using FIG. 1. For this purpose, a first electrically conductive contact layer 21 is applied to a substrate 20 and is interrupted by means of laser patterning, for example along a line. The optically active layer 22 is preferably also identically applied to the first electrically conductive contact layer 21 and is likewise interrupted by this first patterning step. The trench 23 formed in this manner is then filled with an electrically insulating layer 24 and only the optically active layer is then interrupted in a second laser patterning step. A second electrically conductive contact layer 25 is then applied over the entire module structure, which contact layer fills the trench 26 produced during the second laser patterning step and thus produces an electrically conductive contact 27 between the first electrically conductive contact layer 21 and the second electrically conductive contact layer 25. In a third step, the second electrically conductive contact layer and the optically active layer 22 underneath the latter are finally interrupted 28 by means of a third laser patterning step, as a result of which a junction results between the two photovoltaically active regions 30, 31, which junction has a horizontal sequence containing an interruption 24 in the first electrically conductive contact layer 21, an electrically conductive connection 27 between the first electrically conductive contact layer 21 and the second electrically conductive contact layer 25 and an interruption 28 in the second electrically conductive contact layer 25. As a result, the flow of current S through the photovoltaic module structure 32 is controlled in such a manner that a series connection of adjacent photovoltaically active regions 30, 31 results, as is illustrated in purely schematic form in FIG. 1.

The disadvantage of this known structure 32 and the production method used for the latter is that firstly three patterning steps which are carried out in different systems are required in this case. In addition, the three patterning steps are carried out in a manner locally separated from one another, with the result that optically inactive regions A, B are produced inside the photovoltaic module structure 32, which regions usually have a width of approximately 200 μm, in order to form a positioning tolerance for the patterning, and give rise to a loss of efficiency.

The object of the present invention is therefore to provide a photovoltaic module structure and a method for producing an electrically conductive connection between two contact layers spaced apart from one another, which structure and method are used to overcome these disadvantages. In particular, the photovoltaic module structure is intended to allow a higher level of efficiency and the production method is intended to allow the production of more cost-effective photovoltaic module structures.

This object is achieved with a photovoltaic module structure and a production method as described herein.

The photovoltaic module structure according to the invention, in particular for thin-film photovoltaics, has at least two photovoltaically active regions, each region having, in the vertical direction, at least one optically active layer which is arranged between two electrical first and second contacts, the contacts each comprising at least one electrically conductive layer, the two regions horizontally adjoining one another with a junction in such a manner that the junction between the two regions comprises a horizontal sequence of a first electrical line interruption between the first contacts of the first region and of the second region, an electrical line connection between the second contact of the first region and the first contact of the second region and a second electrical line interruption between the second contacts of the first region and of the second region, with the result that the two regions are connected in series, at least the electrical line connection and the second electrical line interruption directly adjoining one another. This increases the level of efficiency because there are no longer any inactive regions between the electrical line connection and the second electrical line interruption. The photovoltaic module structure is preferably arranged on a transparent substrate, in particular glass, because then both laser patterning can be effected through the substrate and the photovoltaic module structure is active from the substrate side.

The junction is expediently in the form of substantially vertical patterning. It can then be produced in a particularly simple manner.

The first electrical line interruption is preferably likewise provided in the optically active layer of the first region and is preferably in the form of an insulating filler introduced into patterning since this makes it possible to improve the level of efficiency.

If the electrical line connection comprises the material of the first contact and/or of the second contact and, in particular, has a metal or a transparent conductive oxide, the production process can be particularly simple. Alternatively, however, other materials can also be used, as a result of which additional production steps then become necessary.

It is likewise advantageous if the second electrical line interruption is formed by a patterned interruption in the second contact layer of the second region, the interruption preferably also extending at least over the optically active layer of the second region. The level of efficiency can then likewise be improved.

It is particularly desirable if the electrical line connection has a width in the range of 0.01 to 50 μm, preferably 5 to 40 μm, and particularly 30 μm. This enables particularly cost-effective production while simultaneously ensuring a sufficiently high flow of current in the series circuit.

It is particularly advantageous if the optically active layers and the electrical first contacts and second contacts are in the form of a horizontally uniformly deposited photolayer and a first contact layer and a second contact layer.

In this connection, it is expedient if the photolayer has the materials CdTe and CdS, the first contact layer has a transparent conductive oxide, preferably ITO, and the second contact layer has Mo, the first electrical line interruption comprises varnishes, photoresist or the like as the electrically insulating filling material, and the second electrical line interruption comprises air as the electrically insulating filling material, the first contact layer preferably having a thickness in the range of 0.01 to 1 µm, preferably 0.05 to 0.5 µm, and particularly 0.25 µm, the second contact layer having a thickness in the range of 0.01 to 1 µm, preferably 0.1 to 0.8 µm, and particularly 0.5 µm, the photolayer having a thickness in the range of 0.1 to 10 µm, preferably 1 to 5 µm, and particularly 3 µm, the first electrical line interruption having a width in the range of 5 to 100 µm, preferably 20 to 80 µm, and particularly 50 µm, and the second electrical line interruption having a width in the range of 5 to 100 µm, preferably 20 to 80 µm, and particularly 30 µm. It goes without saying that the regions may also be produced in the form of layers which are not uniformly formed horizontally, in which case the materials just mentioned are nevertheless preferred.

Independent protection is claimed for a method for producing an electrical line connection between at least two contact layers for a series connection, two contact layers arranged in a vertically layered layer system preferably being involved, the contact layers being arranged such that they are spaced apart from one another, an asymmetrical patterning step being carried out in order to simultaneously produce the electrical line connection and a directly adjoining electrical line interruption in one of the two contact layers. As a result of the asymmetrical patterning pulse, both the electrical line connection and a directly adjoining electrical line interruption can be produced in a single patterning step, as a result of which the production method becomes simpler and more cost-effective in comparison with previous production methods. In particular, a positioning step between the second and third laser patterning steps is saved since both patterning steps now take place at the same time. This avoids positioning problems which are very important on an industrial scale since, in order to achieve high throughput, an individual laser beam is usually guided in this case to the layer packet to be patterned with the aid of a mirror in order to serially produce a large number of linear trenches, for example, and thus to establish a large number of photovoltaically active regions. In order to adapt to positioning errors, tolerances which are provided via the inactive regions A, B with a width of approximately 200 µm are required. At least one such positioning tolerance is now dispensable, which considerably increases the throughput.

In one particularly advantageous refinement, the patterning intensity of the patterning pulse is intended to be so much lower in an outer region of the patterning pulse than in the other regions that the electrically conductive connection between the first contact layer and the second contact layer forms in the structure regions produced with lower patterning intensity, the electrically conductive connection comprising material of the first contact layer and/or of the second contact layer.

The method according to the invention can be expediently used to produce the electrical line connection between the second contact of the first region and the first contact of the second region of the photovoltaic module structure according to the invention but can also be used for other applications in which a series connection is intended to be patterned.

The patterning step is carried out in a particularly expedient manner using laser patterning, and the regions of different patterning intensity are produced by using an asymmetrical optical element and/or by using at least two lasers which have a different intensity and/or by using an asymmetrical filter element. In this context, "optical element" means that refraction, diffraction, scattering and/or reflection is/are intended to be carried out. Such an optical element, for example for linear patterning, could be a glass which is plane parallel over a certain subregion and whose thickness tapers in an arcuate manner, for example, in the other region. It is also possible to use, as further optical elements, mirrors or other reflectors or Fresnel lenses which set an asymmetrical intensity distribution. The asymmetrical optical element is thus intended to reduce intensity in a region by means of refraction, diffraction, reflection and/or scattering.

In this context, "filter element" means that the intensity is reduced by absorption, which may be effected by means of a grayscale filter, for example. On the other hand, complete or partial filtering of individual frequencies may also be alternatively or additionally carried out, as a result of which the intensity can likewise be reduced. Such frequency filtering is possible using a Bragg filter, for example.

Figure 3:
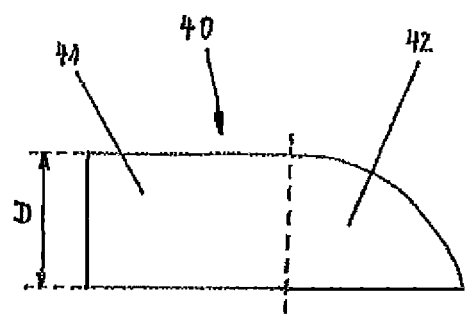
Figure 4:
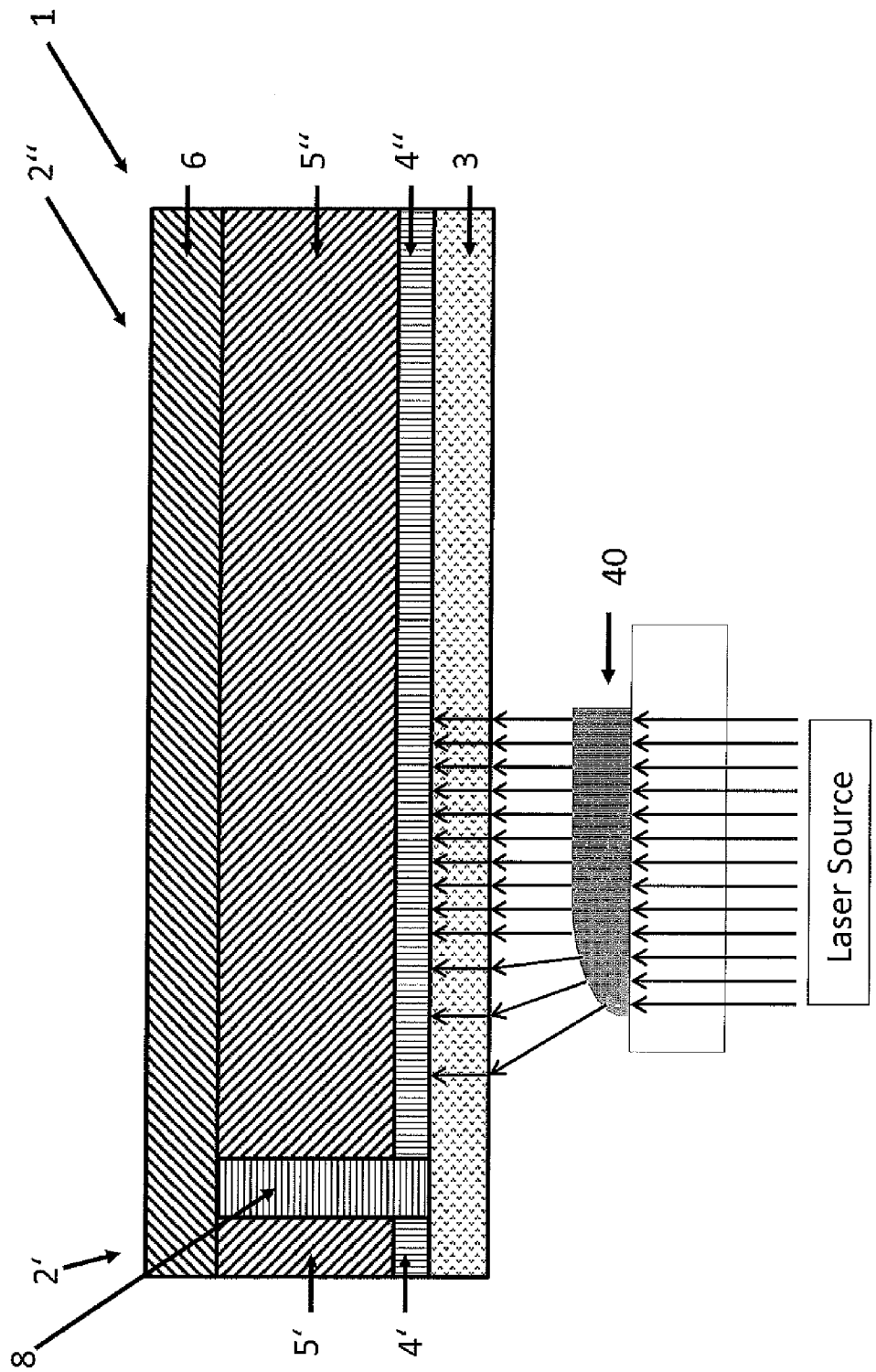
Figure 5:
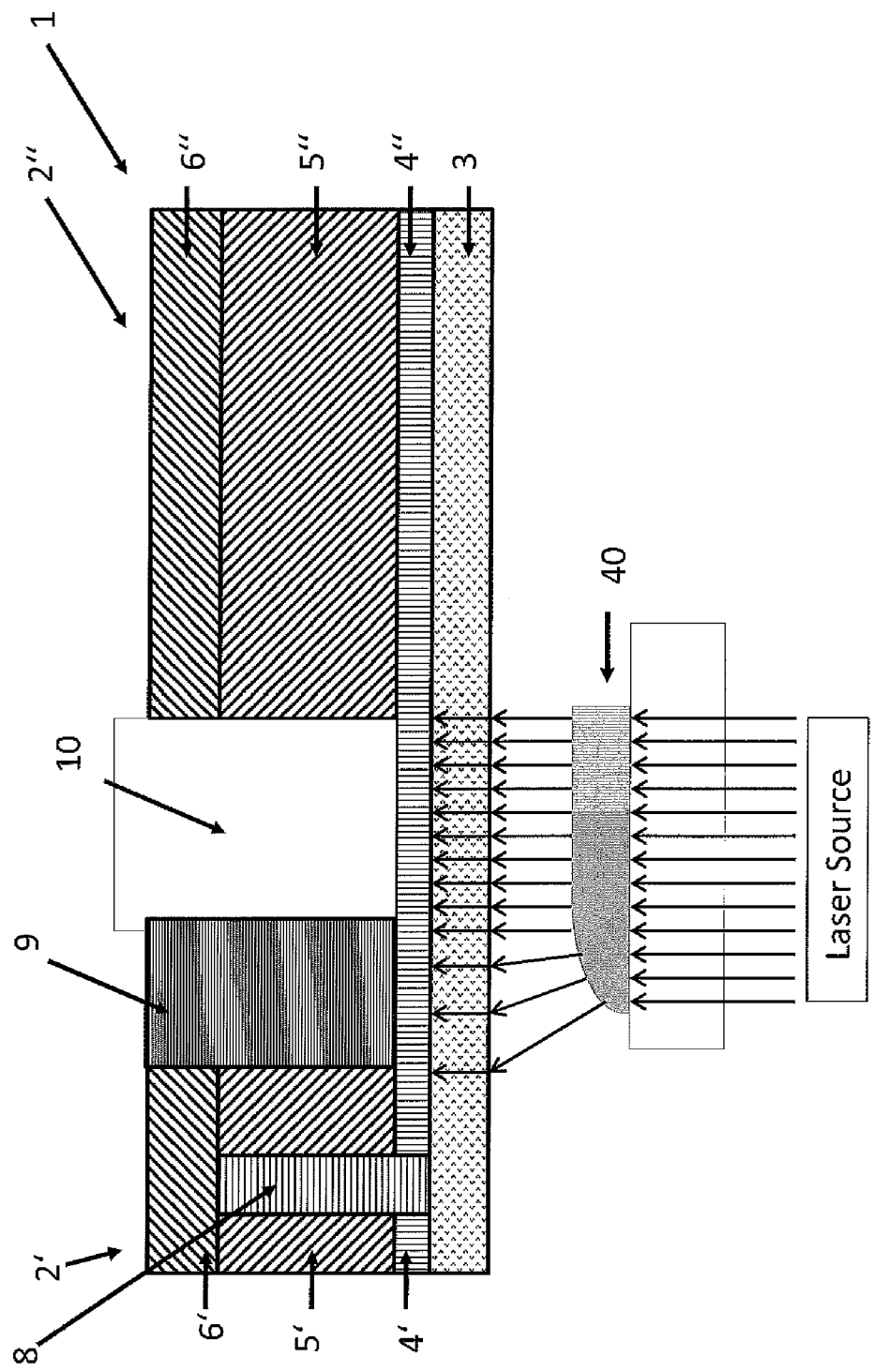

The characteristics and features as well as further advantages of the present invention will become clear below from the description of a preferred exemplary embodiment according to FIG. 2 which illustrates, in a purely schematic manner, a preferred embodiment of the photovoltaic module structure according to the invention in section. In addition, FIG. 3 illustrates, in a purely schematic manner, a preferred optical filter element. FIGS. 4-5 are schematic illustrations of laser beams emitted from a laser source and cooperating with an optical filter element of a photovoltaic module structure to produce an electrical line connection according to an embodiment of the invention.

The photovoltaic module structure 1 has two photovoltaically active regions 2', 2" which are applied to a glass substrate 3 beside one another, as seen in the horizontal direction. Starting from the glass substrate 3, each of the two regions 2', 2" has a first electrically conductive contact 4', 4", an optically active layer 5', 5" and a second electrically conductive contact 6', 6". A junction 7 is provided between the two regions 2', 2" in the horizontal direction. In this case, the junction 7 has a first electrical line interruption 8 which is provided between the two first electrically conductive contacts 4', 4" of the two regions 2', 2" and extends substantially completely along the thickness of the optically active layer 5' of the first region 2'. In a manner separated by a part 11 of the optically active layer 5' of the region 2', an electrical line connection 9 is arranged between the second contact 6' of the first region 2' and the first contact 4" of the second region 2", which first contact of the second region is directly adjoined by a second electrical line interruption 10 which electrically interrupts the two second contacts 6', 6" of the two regions 2', 2" and extends substantially over the entire depth of the optically active layer 5" of the second region 2" as far as the first contact 4" of the second region 2".

On account of the fact that the electrical line connection 9 and the second electrical line interruption 10 directly adjoin one another, the level of efficiency is increased in the photovoltaic module structure according to the invention in comparison with the conventional photovoltaic module structure 32 shown in FIG. 1 by virtue of the fact that the inactive region B is omitted.

The substrate 3 is preferably a glass substrate 3, the first contacts 4', 4" consist of a transparent conductive oxide, for example ITO, the second contacts 6', 6" consist of Mo, and the optically active layers 5', 5" have, viewed from the substrate 3, a layer formation between CdS and CdTe which was activated by temperature regulation. An organic insulating material, for example a photoresist, is preferably selected as the material for the first electrical line interruption 8.

According to an improved refinement (not shown), the first line interruption 8 and the electrical line connection 9 are also formed such that they are directly adjacent to one another, with the elimination of the part 11 of the optically active layer 5', with the result that the level of efficiency is improved further to the effect that the inactive region A in FIG. 1 has also been eliminated. This could be effected, for example, by carrying out the asymmetrical patterning step with such a distance and width that the electrical line connection 9 forms in a manner directly adjacent to the first electrical line interruption 8, the width of the electrical line interruption 8 then needing to be selected in such a manner that positioning tolerances are ensured during laser patterning.

Figure 2:
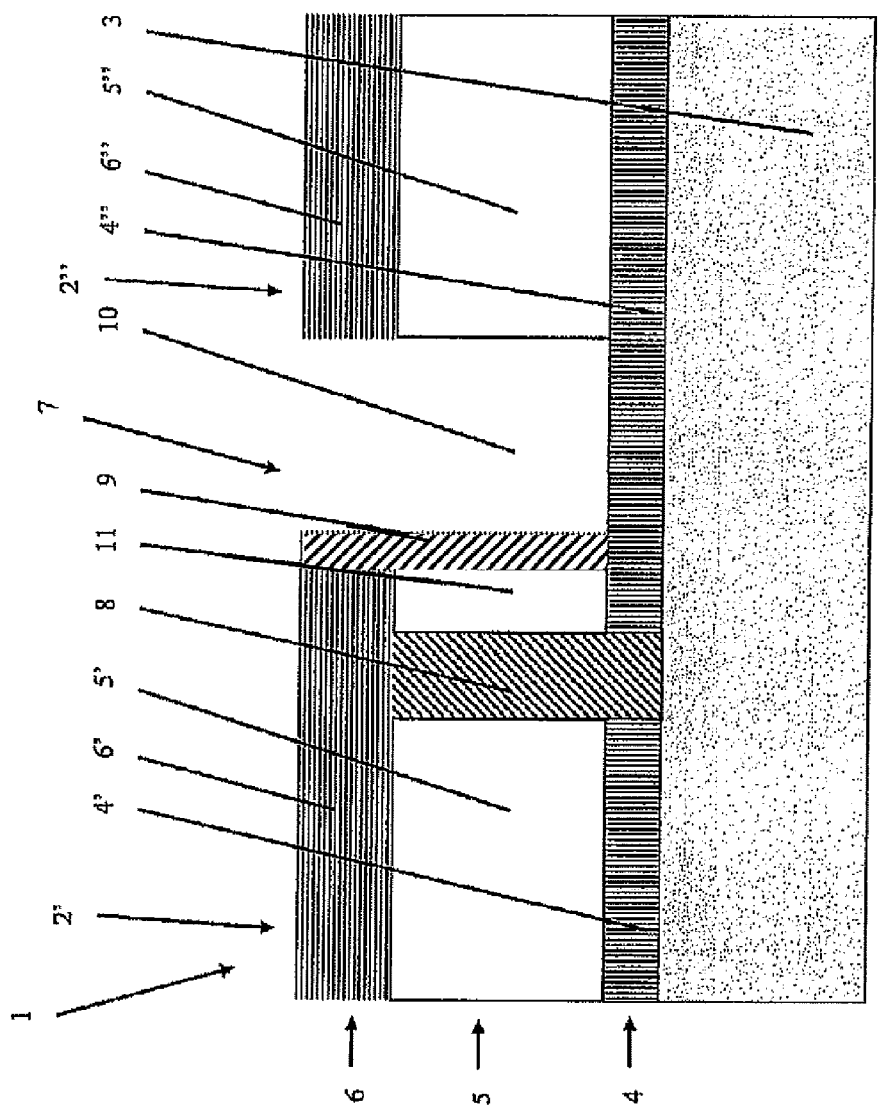

Although the photovoltaic module structure 1 shown in FIG. 2 appears to be obvious at first glance, it is nevertheless surprising to a person skilled in the art since it cannot be produced using the previously used three-step patterning method on an industrial scale on account of positioning inaccuracies and positioning tolerances which are therefore required. Only the inventors provide a surprisingly simple method for producing such a structure.

The method according to the invention is surprising to a person skilled in the art since it is based on a defect within the conventional photovoltaic module structure 32 according to FIG. 1, which defect has only been analyzed by the inventors and is now advantageously used to produce the photovoltaic module structure 1 according to the invention. In detail, the inventors have ascertained that losses in efficiency arise in the known three-step laser patterning method and cannot be readily explained with the unused regions A, B. Within the scope of REM analyses in conjunction with EDX mapping, it was ascertained that shunts have formed in the laser trench of the second electrical line interruption 28 produced in the third patterning step as a result of the fact that sections, in which material of the second contact 26 extends as far as the first contact 21 and thus establishes a local short circuit, exist on the laser edge with respect to the first region 30.

This effect is explained by the fact that the laser pulse used for patterning has shown a lower intensity in this region at the laser edge than in the other regions, with the result that material of the first contact 21 is transferred at this point. It is perhaps possible to illustrate the effect in such a manner that, when cutting through a cake with an applied glaze, the glaze at the cut runs down or is pulled down. This is explained by the fact that the patterning pulse is too weak in this region.

The method according to the invention thus now moves material of the second contact 6' of the first region 2' along the cutting edge toward the first contact 4" of the second region 2" by means of an asymmetrical patterning step in order to produce the electrical line connection 9. However, with suitable patterning, it will also be possible to distribute the material of the first contact 6" of the second region 2" along the cutting edge in order to make contact with the first contact 6' of the first region 2'.

Examinations of the junction 7 ascertained that, on the one hand, a continuous electrical line connection 9 forms and, on the other hand, the second electrical line interruption 10 on the side facing away from the electrical line connection 9 has a sharp insulating profile.

Even if it is assumed here that the patterning pulse is weaker in the region in which the electrical line connection 9 makes contact than in the region of the second electrical line interruption 10, it is also conceivable, in principle, for the patterning pulse to be stronger in the region of the electrical line connection 9 than in the region of the electrical line interruption 10. In principle, the production method according to the invention is thus based on the fact that a uniform but asymmetrical structuring pulse with regard to the regions of the electrical line connection 9 and electrical line interruption 10 which are to be patterned is performed. The patterning intensity is thus intended to be different.

The method can be carried out, for example, with an optical element 40 according to FIG. 3, the optical element 40 having a first region 41, in which plane-parallel boundary layers and thus a constant thickness D are present, and a second region 42, in which the thickness gradually tapers in an arcuate manner starting from the thickness D of the first region 41. Laser beams passing through in a parallel manner with respect to the normal of the first region 41 do not change their direction downstream of the optical element 40 after passing through the first region 41, while laser beams passing through the second region 42 diverge downstream of a focus point. This provides a first region 41 having the same intensity and a second region 42 in which the intensity is reduced by beam expansion.

Even if laser patterning was always assumed above, other known patterning methods can naturally also be used, for example electron beam patterning or ion beam patterning.

As a result of the fact that the photovoltaic module structure 1 from FIG. 2 does not have the unused region B of the photovoltaic module structure from FIG. 1 as a result of the method according to the invention, an absolute efficiency gain of approximately 0.2% was achieved. This means that the efficiency gain was able to be increased by approximately 2% in relative terms, which constitutes significant progress in the production of photovoltaic module structures. In addition, the photovoltaic module structure 1 according to the invention makes it possible to dispense with two process steps, in particular using the method according to the invention. This is because, on the one hand, only a single patterning step, preferably by means of laser beam patterning, is needed to produce the structures for the electrical line connection 9 and the second electrical line interruption 10 and, on the other hand, it is possible to dispense with the introduction of conductive material into the structure of the electrical line connection 9 since this electrical line connection 9 itself forms during the asymmetrical patterning step. Material and time are thus also saved here.

It has become clear from the statements made above that efficiency-optimized photovoltaic module structures 1 result in a particularly simple and cost-effective manner using the photovoltaic module structure 1 according to the invention and by providing the method according to the invention for producing an electrically conductive connection between contact layers spaced apart from one another, the efficiency gain being significant.

However, it goes without saying that the method according to the invention can also be advantageously used in other areas in which at least two contact layers spaced apart from one another are intended to be connected to one another in an electrically conductive manner and an electrical line interruption is required at the same time.

The invention claimed is:
1. A photovoltaic module structure, in particular for thin-film photovoltaics, the module structure comprising:

at least two photovoltaically active regions, each of the regions having, in a vertical direction, at least one optically active layer disposed between a pair of first contacts and a pair of second contacts, each of the first contacts and the second contacts comprising at least one electrically conductive layer;

a junction horizontally adjoining the at least two photovoltaically active regions, the junction comprising a horizontal sequence of a first electrical line interruption disposed between the first contacts of a first one of the regions and a second one of the regions, an electrical line connection disposed between the second contact of the first one of the regions and the first contact of the second one of the regions, and a second electrical line interruption disposed between the second contacts of the first one of the regions and the second one of the regions, the junction adjoining the regions in series, at least the electrical line connection directly adjoining the second electrical line interruption, wherein the electrical line connection has a width in the range of 0.01 µm to 40 µm and is formed from a material of at least one of the first contacts and the second contacts, wherein a phase of the material of the at least one of the first contacts and the second contacts is unchanged; and a transparent substrate receiving the two active regions, wherein the transparent substrate is glass.

2. The photovoltaic module structure according to claim 1, wherein the width of the electrical line connection is 30 µm and the first electrical line interruption, the electrical line connection, and the second electrical line interruption of the junction are in the form of substantially vertical patterning.

3. The photovoltaic module structure according to claim 1, wherein the first electrical line interruption is at least partially disposed in the optically active layer of the first one of the regions and is in the form of an insulating introduced into patterning.

4. The photovoltaic module structure according to claim 1, wherein the electrical line connection comprises at least one of a metal and a transparent conductive oxide.

5. The photovoltaic module structure according to claim 1, wherein the second electrical line interruption is formed by a patterned interruption in the second contact of the second one of the regions, the second electrical line interruption extending over the at least one optically active layer of the second one of the regions.

6. A method for producing an electrical line connection between a first contact layer and a second contact layer of a photovoltaic module structure, in particular a method for producing the electrical line connection between a second contact of a first region and a first contact of a second region of a photovoltaic module structure for a series connection of the first region to the second region comprising the steps of:

executing an asymmetrical patterning with a laser device in order to simultaneously produce and directly adjoin the electrical line connection and an electrical line interruption in one of the first contact and the second contact, the step of executing the asymmetrical patterning comprising the steps of:

emitting a patterning pulse of a laser beam with the laser device, a patterning intensity of the patterning pulse of the laser beam is lower in a first region of the patterning pulse of the laser beam than in a second region of the patterning pulse of the laser beam;

forming the electrical line connection between the first contact and the second contact of the photovoltaic module structure in a portion of at least one of the first region and the second region of the photovoltaic module structure with the first region of the patterning pulse of the laser beam, the electrical line connection comprising a material of at least one of the first contact and the second contact, the asymmetrical patterning distributes the material of the at least one of the first contact and the second contact from at least one of the first contact and the second contact to form the electrical line connection, wherein a phase of the material of the at least one of the first contact and the second contact is unchanged.

7. The method as claimed in claim 6, wherein at least the first region and the second region of the patterning pulse of the laser beam are produced by using an asymmetrical optical element configured to reduce the patterning intensity of the laser beam by means of at least one of refraction, diffraction, reflection and scattering, the optical element is a glass and includes a first region having a shape of a parallelogram and a second region having a thickness tapering in an arcuate manner, wherein at least two lasers having varying intensities cooperate with the optical element to produce the at least first region and the second region of the photovoltaic module structure.

* * * * *